(12) United States Patent
Kawano

(10) Patent No.: US 8,902,592 B2
(45) Date of Patent: Dec. 2, 2014

(54) HEAT SINK AND METHOD FOR FIXING HEAT SINK

(75) Inventor: Kayoko Kawano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1004 days.

(21) Appl. No.: 12/984,128

(22) Filed: Jan. 4, 2011

(65) Prior Publication Data

US 2011/0168350 A1 Jul. 14, 2011

(30) Foreign Application Priority Data

Jan. 12, 2010 (JP) ..................................... 2010-3789

(51) Int. Cl.
*H01L 23/40* (2006.01)

(52) U.S. Cl.
CPC ..... *H01L 23/4093* (2013.01); *H01L 2924/0002* (2013.01)
USPC ......... 361/719; 361/720; 165/80.2; 165/80.3; 24/457

(58) Field of Classification Search
CPC . H01L 23/40; H01L 23/4093; H05K 7/20154
USPC .................... 165/67, 80.3; 361/719
See application file for complete search history.

(56) References Cited

U.S. PATENT DOCUMENTS

| | | | | |
|---|---|---|---|---|
| 5,464,054 A | * | 11/1995 | Hinshaw et al. | 165/80.3 |
| 5,774,335 A | * | 6/1998 | Pare et al. | 361/704 |
| 6,639,800 B1 | * | 10/2003 | Eyman et al. | 361/704 |
| 6,781,837 B2 | * | 8/2004 | Kannmacher et al. | 361/704 |
| 8,050,035 B2 | * | 11/2011 | Yu et al. | 361/697 |
| 8,297,341 B2 | * | 10/2012 | Liang et al. | 165/80.3 |
| 8,613,595 B2 | * | 12/2013 | Ye | 415/213.1 |
| 2006/0067053 A1 | * | 3/2006 | Yu et al. | 361/704 |
| 2009/0040729 A1 | * | 2/2009 | Deng et al. | 361/710 |
| 2009/0141453 A1 | * | 6/2009 | Chen et al. | 361/709 |
| 2010/0002396 A1 | * | 1/2010 | He et al. | 361/709 |

FOREIGN PATENT DOCUMENTS

| | | |
|---|---|---|
| JP | 11-150220 A | 6/1999 |
| JP | 2002-261213 A | 9/2002 |
| JP | 2004-528723 A | 9/2004 |
| JP | 2005-150192 A | 6/2005 |
| JP | 3139706 U | 2/2008 |
| WO | WO 02/097882 A1 | 12/2002 |

OTHER PUBLICATIONS

Japanese Office Action mailed Jun. 11, 2013 for corresponding Japanese Application No. 2010-003789, with Partial English-language Translation.

* cited by examiner

*Primary Examiner* — Allen Flanigan
(74) *Attorney, Agent, or Firm* — Staas & Halsey LLP

(57) ABSTRACT

A heat sink for cooling a device mounted on a mount board, the heat sink having a plurality of grooves at different heights in a surface opposite a surface in contact with the device.

11 Claims, 15 Drawing Sheets

DIFFERENT
CONNECTING MEMBERS

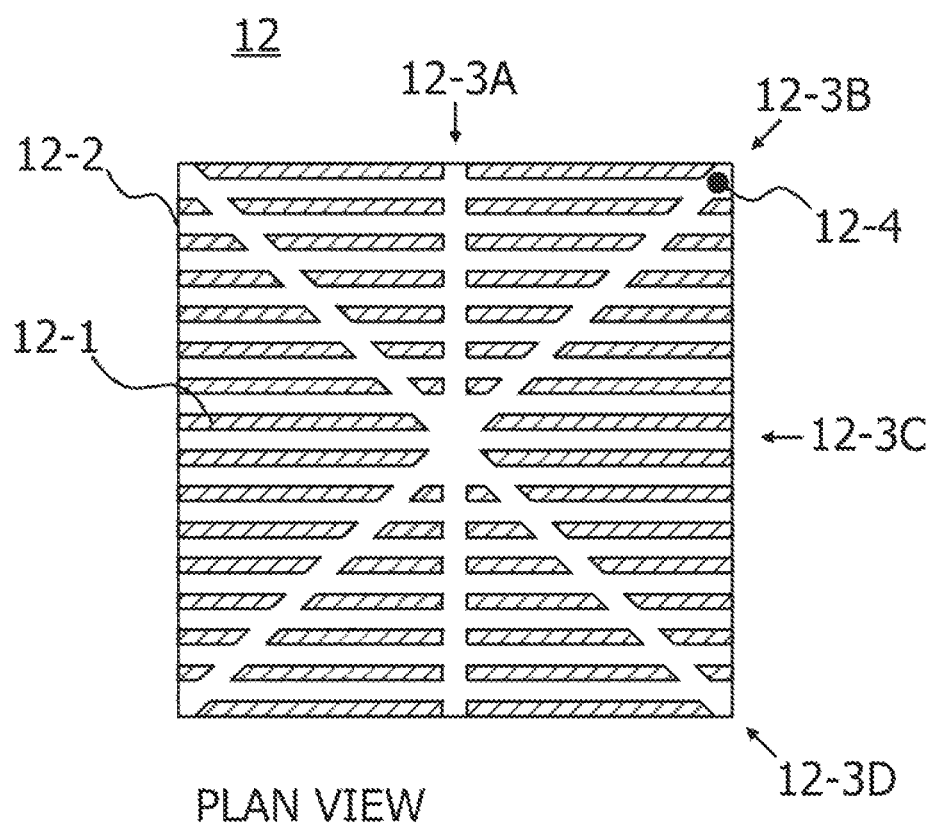

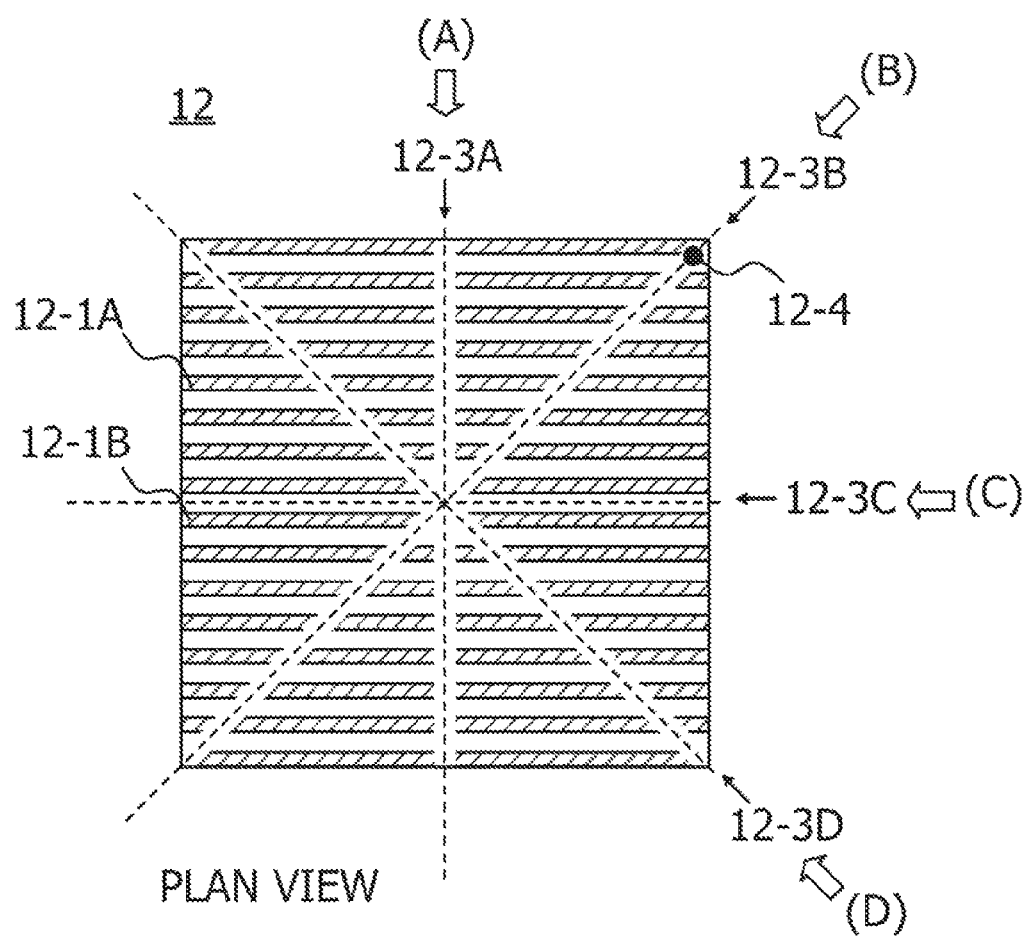

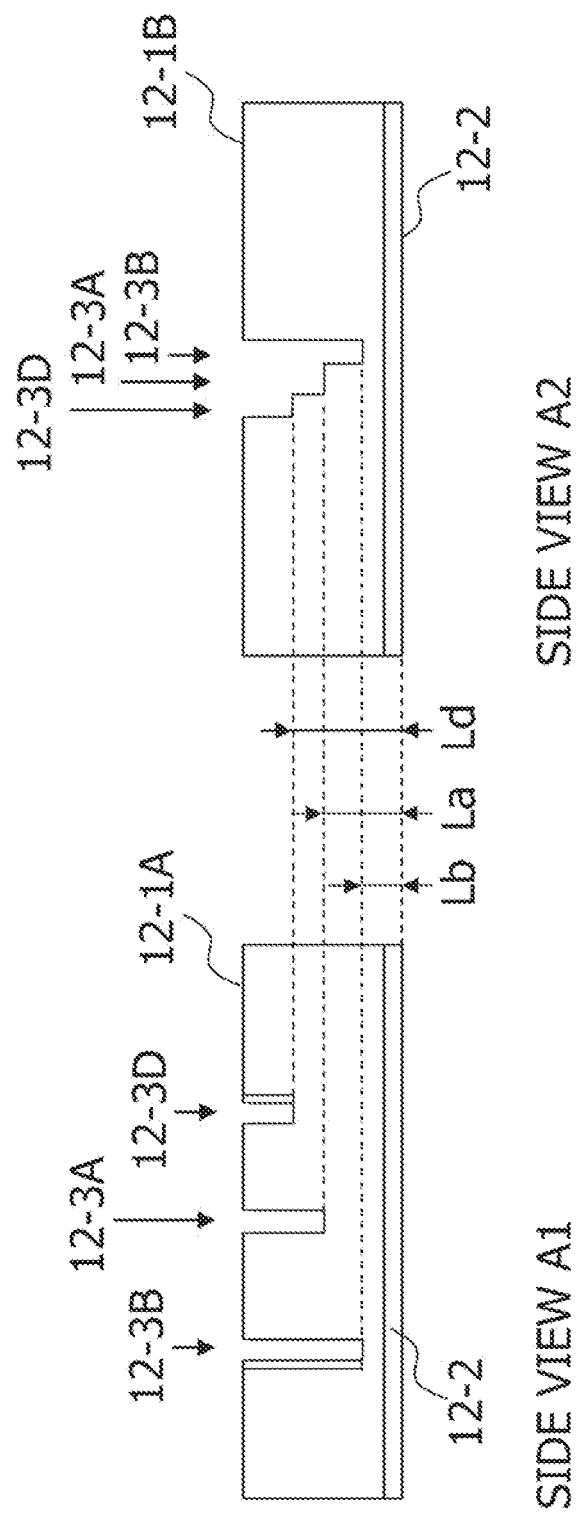

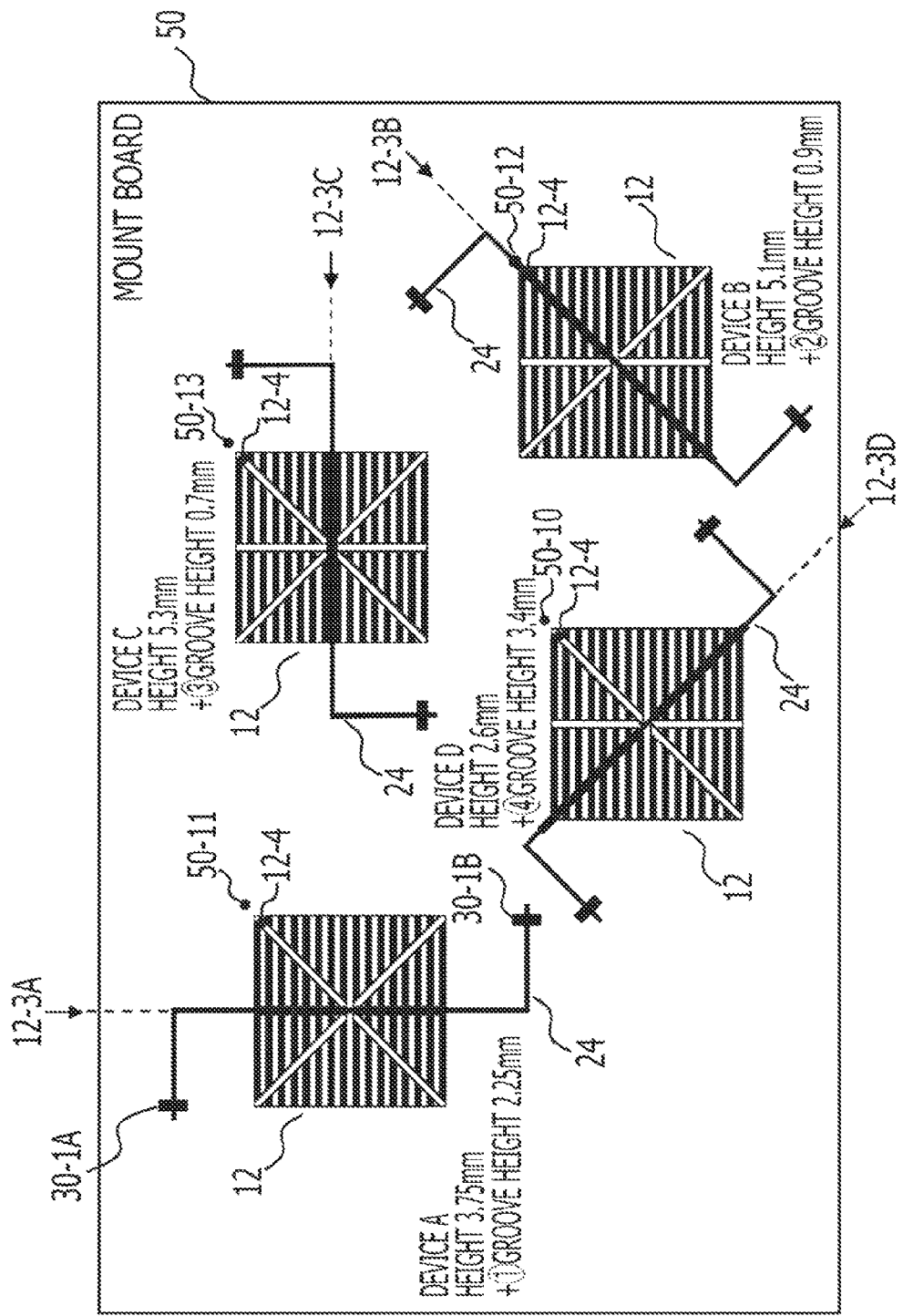

HEAT SINK AND METHOD FOR FIXING HEAT SINK

CROSS-REFERENCE TO RELATED APPLICATION

This application is based upon and claims the benefit of priority of the prior Japanese Patent Application No. 2010-3789, filed on Jan. 12, 2010, the entire contents of which are incorporated herein by reference.

FIELD

The embodiments discussed herein are related to a heat sink and a method for fixing the heat sink.

BACKGROUND

When a semiconductor device on a mount board consumes a large amount of power, the semiconductor device has to be cooled within an operating temperature range using, for example, a heat sink for cooling to secure the operation of the semiconductor device. In one method, a heat sink is mounted using a spring-like retaining member. When a heat sink is mounted on a semiconductor device using a spring-like retaining member, in order to ensure the cooling performance of the heat sink while avoiding placing stress on the semiconductor device, a press-fitting force exerted on the semiconductor device from the heat sink has to be within a certain range.

Semiconductor devices vary in height according to the manufacturer and packaging material. Thus, when semiconductor devices having different heights are mounted on a mount board, several types of spring-like retaining members for fixing heat sinks, or several types of connecting members with which the retaining members are engaged, are used.

FIG. 1 illustrates an example of a heat sink mounted using a spring-like retaining member. In the example in FIG. 1, a spring-like retaining member 20 is fitted to a groove between fins provided on the surface of a heat sink 10, and the heat sink 10 is mounted on a semiconductor device (not illustrated) by means of the elastic force of the spring-like retaining member 20. The ends of the spring-like retaining member 20 can be engaged with connecting members 30 provided on a mount board. FIG. 2 illustrates an example in which a heat sink 11 having pin-like fins is mounted on a semiconductor device (not illustrated) using a spring-like retaining member 21. In this example as well, the spring-like retaining member 21 is fitted to a groove between the pin-like fins, and the ends of the retaining member 21 are engaged with connecting members 31 provided on a mount board, whereby the heat sink 11 is mounted on the semiconductor device by means of the elastic force of the spring-like retaining member 21.

As illustrated in FIGS. 1 and 2, when the heat sinks 10 or 11 are mounted on semiconductor devices having different heights using the spring-like retaining members 20 or 21, in order to mount the heat sinks on the semiconductor devices with a uniform press-fitting force, it is necessary to change the angle of both wings having sections for engaging the ends of the retaining members 20 or 21 or to change the heights of the connecting members 30 or 31.

FIG. 3 illustrates an example in which the same kind of heat sinks 10 are mounted on semiconductor devices 40 and 41 having different heights on a mount board 50, using retaining members 20 and 22 having different heights. In FIG. 3, the connecting members 30 having the same heights are used. To mount the heat sink 10 on the semiconductor device 41 having a tall height, the retaining member 22 having a tall height is used. To mount the heat sink 10 on the semiconductor device 40 having a short height, the retaining member 20 having a short height is used.

FIG. 4 illustrates an example in which the same heat sinks 10 are mounted on the semiconductor devices 40 and 41 having different heights on the mount board 50, using connecting members 30 and 32 having different heights. In FIG. 4, the same retaining members 20 are used. To mount the heat sink 10 on the semiconductor device 41 having a tall height, the connecting members 32 having a tall height are used. To mount the heat sink 10 on the semiconductor device 40 having a short height, the connecting members 30 having a short height are used.

Japanese Laid-open Patent Publication Nos. 11-150220 and 2005-150192 disclose methods for mounting a heat sink. However, in either case, when heat sinks are mounted on semiconductor devices having different heights, the height of retaining members or the height of connecting members has to be changed.

As described above, when heat sinks have grooves that receive the retaining member at the same height, in order to mount the same heat sinks on semiconductor devices having different heights, various types of retaining members or connecting members corresponding to the number of heights of the semiconductor devices are needed. The use of various types of retaining members or connecting members may lead to an incorrect choice of components, resulting in a mounting error. A mounting error may cause excessive pressure to be applied to components, damaging the components, or it may result in insufficient press-fitting force, causing cooling failure.

Thus, the present application addresses enabling the same heat sinks to be mounted on the semiconductor devices using the same retaining members and the same connecting members, and with the same press-fitting force when assembling a mount board on which semiconductor devices having different heights and requiring heat sinks are mounted.

SUMMARY

According to an aspect of the embodiments, a heat sink for cooling a device mounted on a mount board has a plurality of grooves at different heights in a surface opposite a surface in contact with the device.

The object and advantages of the various embodiments will be realized and attained by means of the elements and combinations particularly pointed out in the claims.

It is to be understood that both the foregoing general description and the following detailed description are exemplary and explanatory and are not restrictive of the various embodiments, as claimed.

BRIEF DESCRIPTION OF DRAWINGS

FIG. 5 is a plan view of a heat sink according to a first embodiment.

FIG. 6 is a plan view illustrating the positions of grooves in the heat sink according to the first embodiment.

FIG. 8 illustrates side views of the fins of the heat sink according to the first embodiment.

FIG. 15 illustrates a mounting example in which the heat sinks according to the first embodiment are mounted on the mount board.

DESCRIPTION OF EMBODIMENTS

Figure 1:
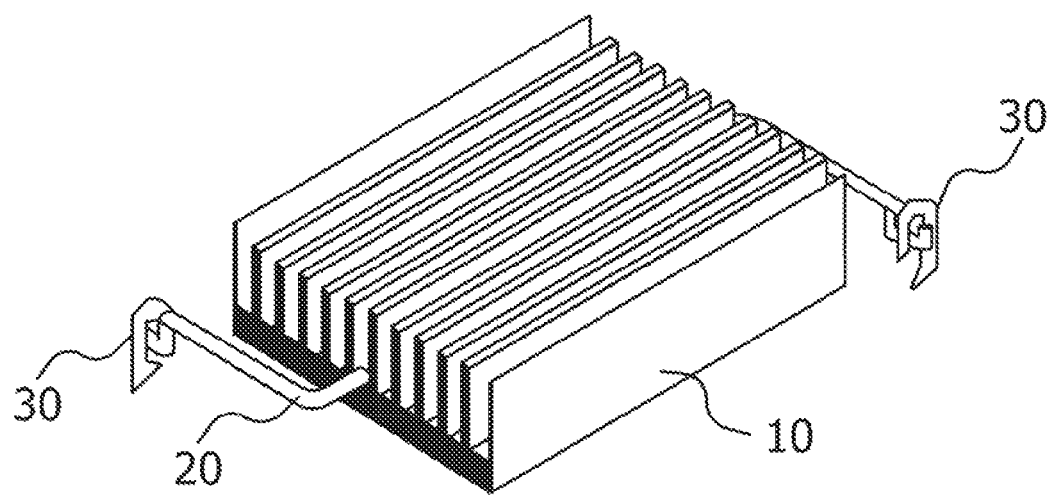
FIG. 1 illustrates an example in which a heat sink is mounted using a spring-like retaining member.

Embodiments of the present invention will be described below in detail.

FIG. 5 is a plan view of a heat sink 12 according to a first embodiment. The heat sink 12 according to the first embodiment includes a base section 12-2 and multiple plate-like fins 12-1 having cutout sections, which are arranged on the base section 12-2. FIG. 5 illustrates the outline of the base section 12-2 and the top surfaces of the fins 12-1 indicated with hatching. The heat sink 12 has four grooves, namely, 12-3A, 12-3B, 12-3C, and 12-3D, at different heights. The four grooves extend along the diagonals of the base 12-2 and the longitudinal and lateral lines passing through the center thereof.

The heights of the grooves formed in the heat sink 12, that is, the heights from the bottom surface of the heat sink 12 to the bottoms of the grooves, are determined as follows: for example, when the heat sinks 12 are to be mounted on four semiconductor devices having different heights, the heights of the grooves in the heat sinks 12 are determined according to the heights of the semiconductor devices. Specifically, the semiconductor devices having different heights are each made to correspond to one of the grooves in the heat sink 12 such that the sum of the height of each semiconductor device and the height of the corresponding groove is identical or similar.

When the heat sinks 12 are mounted on the semiconductor devices on the mount board, the retaining members are fitted to the grooves at heights corresponding to the heights of the semiconductor devices. Thus, the heat sinks 12 are mounted on the semiconductor devices. By mounting the heat sinks 12 on the semiconductor devices by fitting the spring-like retaining members to the grooves in the heat sinks 12 at heights corresponding to the heights of the semiconductor devices, the same heat sinks can be mounted on semiconductor devices having different heights, using the same retaining members and the same connecting members, and with the same press-fitting force.

FIG. 6 is a plan view illustrating the positions of the grooves in the heat sink according to the first embodiment. In FIG. 6, dashed lines extend along the four grooves, namely, 12-3A, 12-3B, 12-3C, and 12-3D, which extend in directions (A) to (D) and are provided at different heights. The four grooves indicated with the dashed lines in FIG. 6 do not necessarily have to be formed as grooves having a uniform height with respect to the bottom surface of the heat sink 12 as long as they have a plurality of contact points to which the retaining member can be fitted at a certain height from the bottom surface of the heat sink 12. Thus, if the grooves extend in the directions intersecting the fins 12-1, cutout sections (notches) having substantially equal widths may be formed in the fins 12-1, at a certain height from the bottom surface of the heat sink 12, so that the notches in the fins constitute the grooves. In this case, the retaining members are in contact with the grooves at the notches in the fins constituting the grooves. Using side views and cross-sectional views of the heat sink 12, the grooves extending in the directions (A) to (D) will be described in detail.

Figure 7A:
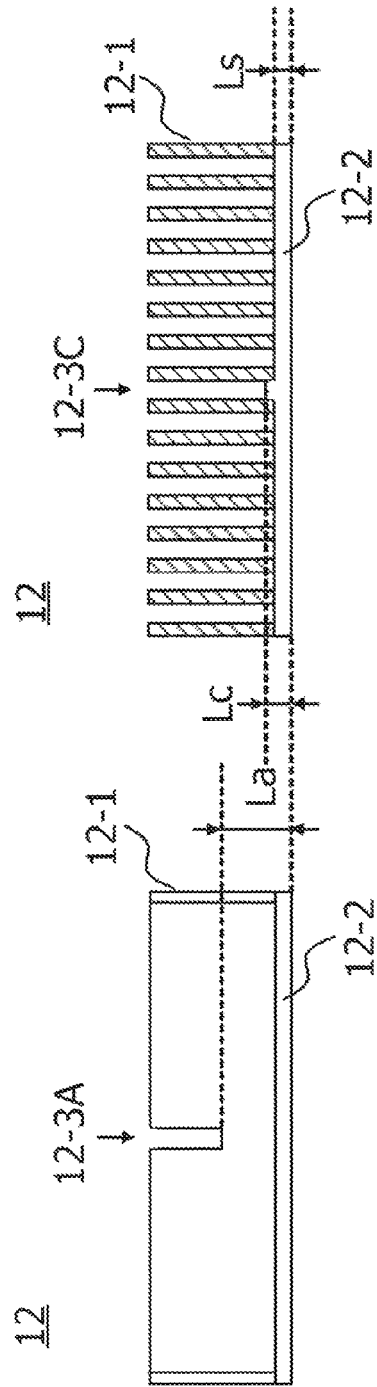
FIGS. 7A to 7D are side views of the heat sink according to the first embodiment.

FIGS. 7A, 7B, 7C, and 7D are side views of the heat sink 12 according to the first embodiment, viewed from the directions (A), (B), (C), and (D) in FIG. 6, respectively. FIG. 7A is a side view of the heat sink 12 viewed in the direction (A) in FIG. 6. The groove 12-3A at the arrow in FIG. 7A is formed by providing cutout sections in the middle of the fins 12-1, the cutout sections extending from the upper ends of the fins 12-1 to a height La from the bottom surface of the base section 12-2. The groove has a width such that the spring-like retaining members for mounting the heat sink on the semiconductor device on the mount board can be fitted to the bottom of the groove.

Figure 7B:
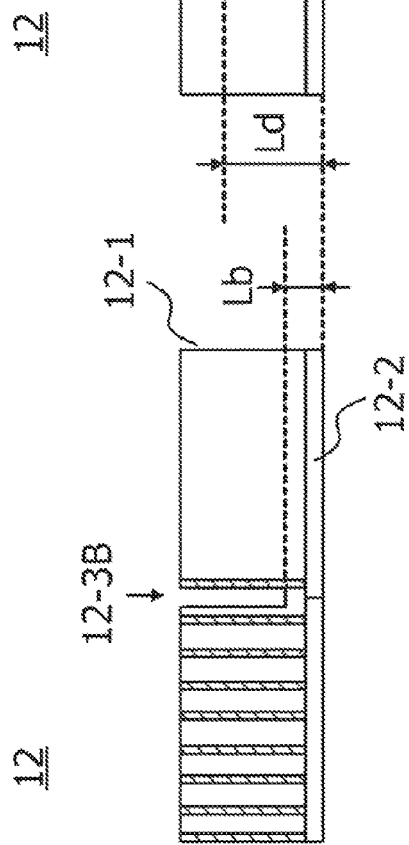

FIG. 7B is a side view of the heat sink 12 viewed in the direction (B) in FIG. 6. The groove 12-3B at the arrow in FIG. 7B is formed by providing cutout sections at a plurality of positions where the fins 12-1 on the heat sink 12 intersect the diagonal of the heat sink 12 extending in the direction (B), the cutout sections extending from the upper ends of the fins 12-1 to a height Lb from the bottom surface of the base section 12-2.

Figure 7C:

FIG. 7C is a side view of the heat sink 12 viewed in the direction (C) in FIG. 6. The groove 12-3C at the arrow in FIG. 7C is located between two fins at the middle and has a height Lc. In this case, a part of the base section 12-2 of the heat sink 12 may be formed in a protruding shape to adjust the height of the groove 12-3C. Alternatively, the groove 12-3C may be formed as part of the fins 12-1 when the fins 12-1 are fabricated. In addition, the groove 12-3C at a height Lc may be formed by fixing another member. When the groove 12-3C is provided at a level lower than the base section 12-2 at a height Ls, the groove may be formed at a desired height by forming part of the base section 12-2 in a recessed shape. Also when the groove extending in the direction other than the direction (C) is provided at a level lower than the base section 12-2, the groove may be formed at a desired height by providing cutout sections extending to the lower ends of the fins 12-1 and by forming a part of the base section 12-2 in a recessed shape.

Figure 7D:
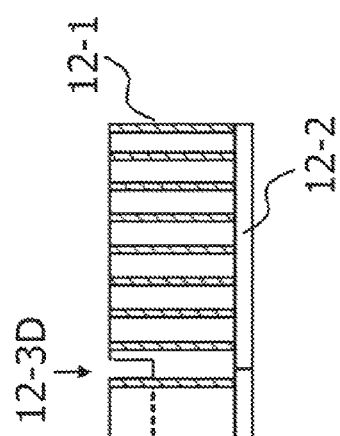

FIG. 7D is a side view of the heat sink 12 viewed in the direction (D) in FIG. 6. The groove 12-3D at the arrow in FIG. 7D is formed along the diagonal in the direction (D), at a height Ld, using the same method as the groove 12-3B in FIG. 7B. Similarly to the case of FIG. 7A, the groove in FIGS. 7B, 7C, and 7D has a width such that the spring-like retaining member can be fitted to the bottom of the groove. Furthermore, although the grooves 12-3B and 12-3D in the direction (B) and the direction (D) are provided along the diagonals of the heat sink 12 in the first embodiment, these grooves do not necessarily have to be provided along the diagonals, but may be provided in directions not overlapping the other grooves.

Although the heat sink having four grooves extending in the directions (A) to (D) are illustrated in the first embodiment, the number of grooves provided in the heat sink may be two, six, or eight. Furthermore, in the first embodiment, the grooves extending in the directions (A) to (D) are provided so as to pass through the center of the heat sink 12, the positions of the grooves are not limited to those in the first embodiment. For example, when the center of the heat sink is not aligned with the center of gravity of the heat sink, the grooves may be provided so as to pass through the center of gravity of the heat sink. In other words, the grooves that receive the retaining member may be provided at any position, as long as the heat sink mounted on the semiconductor device on the mount board can apply uniform pressure on the semiconductor device.

Although the heat sink according to the first embodiment is mounted on the semiconductor device using one retaining member, as long as the heat sink can apply uniform pressure on the semiconductor device, the heat sink may have a plurality of grooves at the same heights and may be mounted on the semiconductor device using a plurality of retaining members. It is of course possible that one groove is provided in one direction, to which one retaining member is fitted, and a plurality of grooves are provided at the same heights in another direction, to which a plurality of retaining members are fitted.

Although not illustrated in this embodiment, when, for example, a substantially linear retaining member is used, the grooves do not need to be formed such that the retaining member is fitted from above the heat sink as in this embodiment, but may be formed such that holes penetrating the fins are provided at a predetermined height, through which the retaining member is inserted from the side of the heat sink. Thus, a method for providing grooves at different heights in the heat sink can be variously modified within a scope not departing from the gist of the present invention.

FIG. 8 illustrates two of the fins 12-1, namely, 12-1A and 12-1B, of the heat sink 12 in FIG. 6. SIDE VIEW A1 and A2 of FIG. 8 illustrate side views of the fins 12-1A and 12-1B with the base section 12-2, viewed from the direction (A) in FIG. 6. SIDE VIEW A1 is a side view of the fin 12-1A with the base section 12-2 in FIG. 6, and SIDE VIEW A2 is a side view of the fin 12-1B with the base section 12-2 in FIG. 6.

The fin 12-1A has a cutout section in the middle, which constitutes the groove 12-3A extending in the direction (A) in FIG. 6. The fin 12-1A has a cutout section on the left side of the groove 12-3A, which constitutes the groove 12-3B extending in the direction (B) in FIG. 6, and a cutout section on the right side of the groove 12-3A, which constitutes the groove 12-3D extending in the direction (D) in FIG. 6. As has been described above, these cutout sections have a width such that the retaining member for mounting the heat sink 12 can be fitted to the bottom of the groove.

SIDE VIEW A2 of FIG. 8, which is a side view of the fin 12-1B, illustrates that the grooves 12-3B, 12-3A, and 12-3D extending in the directions (A), (B), and (D) in FIG. 6 pass the fin 12-1B, at positions slightly shifted from one another, thereby forming a step-like cutout section. The fins in FIG. 6 other than the fins 12-1A and 12-1B also have cutout sections corresponding to the heights of the grooves, at positions where the fins intersect the grooves extending in the directions (A) to (D).

Figure 9:
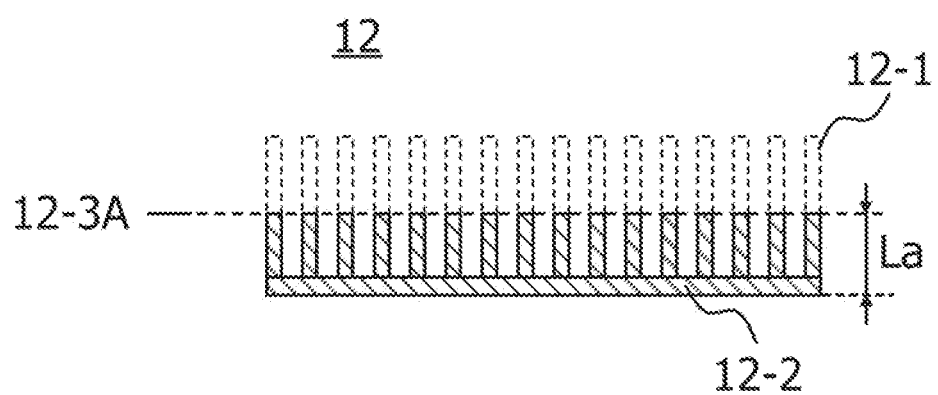
FIG. 9 is a cross-sectional view of the grooves in the heat sink according to the first embodiment.

FIG. 9 is a cross-sectional view of the groove 12-3A in the heat sink 12 in FIG. 6. The groove 12-3A is formed of cutout sections provided in the middle of the fins 12-1, the cutout sections extending to a height La. The groove 12-3A does not necessarily have to be formed as a continuous groove formed at a height La from the bottom surface of the heat sink 12, but may be formed as a discontinuous groove having intermittent contact points at which the retaining member is in contact with the lower ends of the cutout sections provided in the fins 12-1 on the heat sink 12. Note that, in FIG. 9, the dashed lines on the upper side of the fins 12-1 explicitly indicate the sections of the cutout sections above the groove 12-3A.

Figure 10:
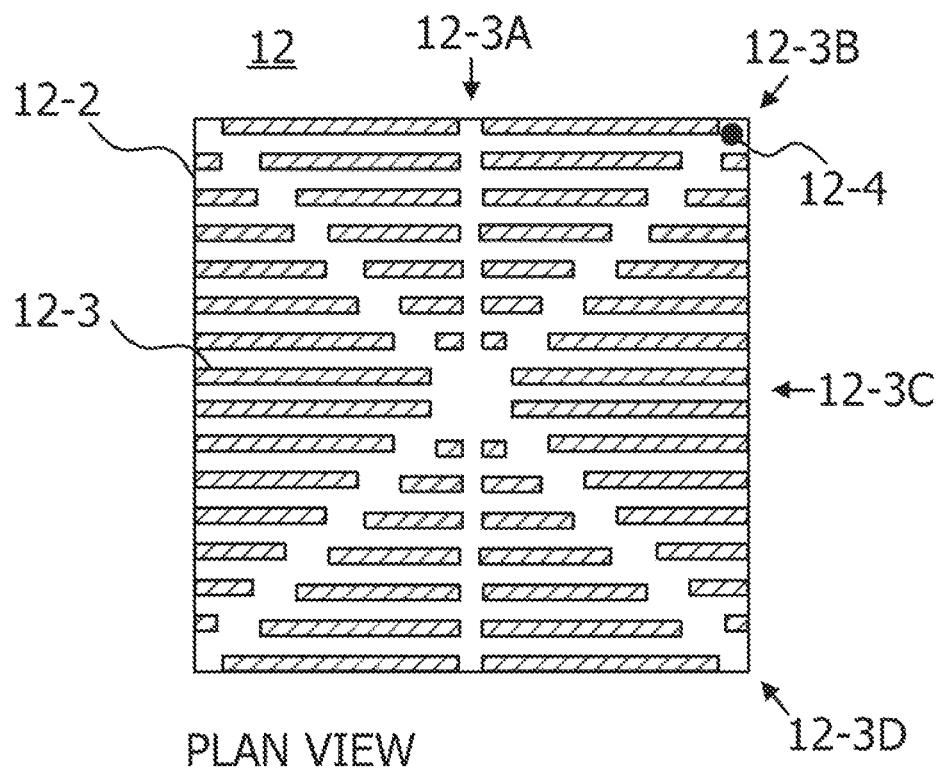
FIG. 10 illustrates a modification of the fins of the heat sink according to the first embodiment.

FIG. 10 illustrates a modification of the fins of the heat sink 12 according to the first embodiment. Fins 12-3 in FIG. 10 differ from the fins 12-1 in FIG. 5 in shape, and the fins 12-3 have substantially square edges formed by trimming sharp edges along the grooves. Although not illustrated, in addition to the substantially square edges, the fins may have substantially round edges. Thus, by changing the shapes of the fins, fabrication of the fins can be simplified and the flow of cooling air can be changed.

Figure 11:
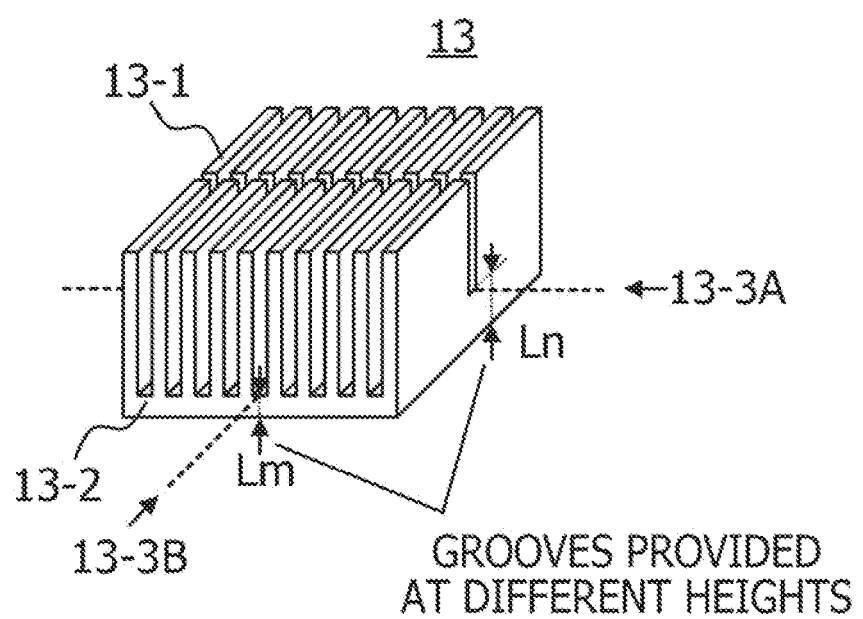
FIG. 11 is a perspective view of a heat sink according to a second embodiment.

FIG. 11 is a perspective view of a heat sink 13 according to a second embodiment. The heat sink 13 according to the second embodiment has grooves at two heights. The heat sink 13 includes a base section 13-2 and multiple plate-like fins 13-1 having cutout sections in the middle thereof, which are formed as a single component. The heat sink 13 has a groove 13-3B at a height Lm, which extends along the plate-like fins 13-1, and a groove 13-3A at a height Ln, which extends in the direction intersecting the fins 13-1 and is formed of a plurality of cutout sections provided in the fins.

Figures 12A, 12B:
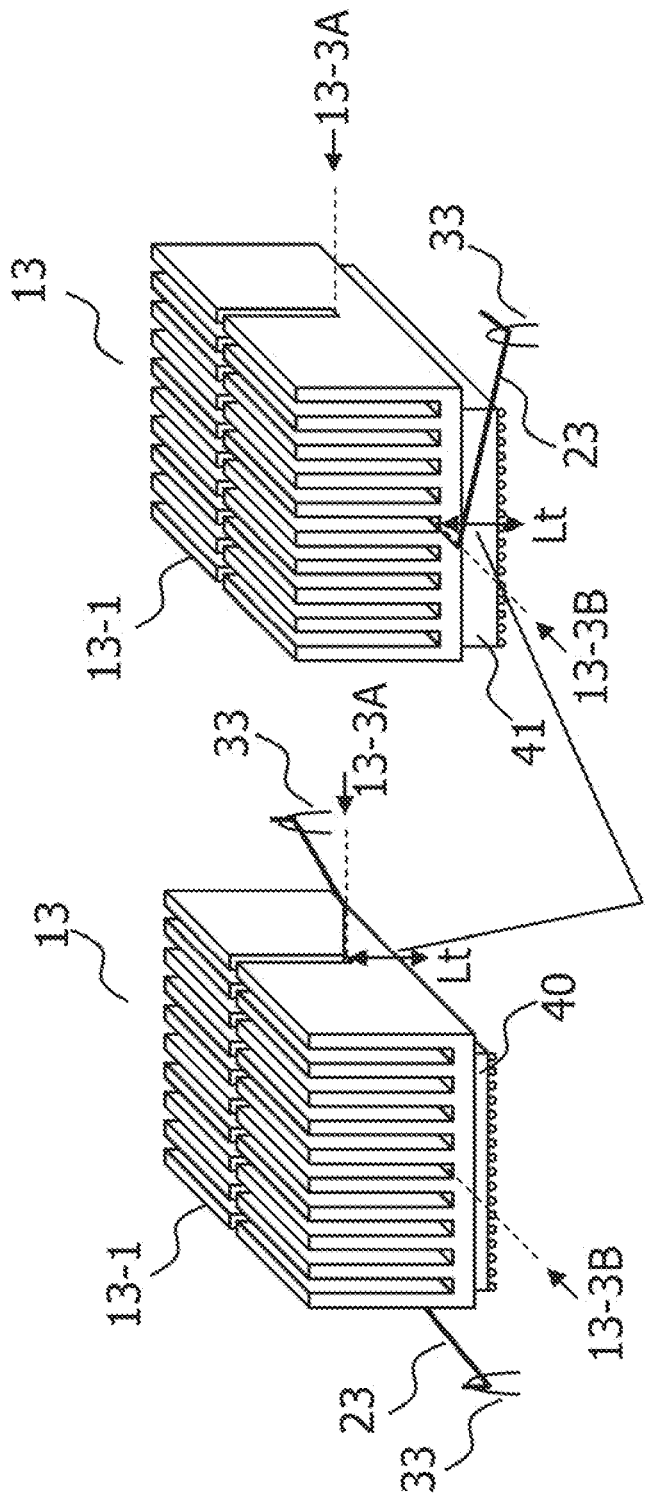
FIGS. 12A and 12B illustrate mounting examples of the heat sink according to the second embodiment.

FIGS. 12A and 12B illustrate mounting examples of the heat sink 13 according to the second embodiment. FIG. 12A illustrates an example in which the heat sink 13 is mounted on a semiconductor device 40 having a short height, and FIG. 12B illustrates an example in which the heat sink 13 is mounted on a semiconductor device 41 having a tall height. These examples will be described on the assumption that the sum of the height of the semiconductor device 40 and the height Ln of the groove 13-3A in FIG. 11 and the sum of the height of the semiconductor device 41 and the height Lm of the groove 13-3B in FIG. 11 are equivalent. Note that the sum of the height of the semiconductor device 40 and the height Ln, and the sum of the height of the semiconductor device 41 and the height Lm do not have to be exactly the same. As long as these sums are substantially the same, the advantage of the present invention can be obtained.

When the heat sink 13 is mounted on the semiconductor device 40 having a short height, a retaining member 23 is fitted to the groove 13-3A, as illustrated in FIG. 12A. Then, the ends of the retaining member 23 are engaged with connecting members 33 provided on the mount board. Thus, the heat sink 13 is mounted on the semiconductor device 40. The height Lt in FIG. 12A represents the height from the surface of the mount board to the lower end of the groove 13-3A in the heat sink 13, to which the retaining member 23 is fitted. The height Lt is equivalent to the sum of the height of the semiconductor device 40 and the height Ln of the groove 13-3A.

When the heat sink 13 is mounted on the semiconductor device 41 having a tall height, the retaining member 23 is fitted to the groove 13-3B, as illustrated in FIG. 12B. Then, the ends of the retaining member 23 are engaged with connecting members 33 provided on the mount board. Thus, the heat sink 13 is mounted on the semiconductor device 41. Similarly to the case of FIG. 12A, the height Lt in FIG. 12B represents the height from the surface of the mount board to the lower end of the groove 13-3B in the heat sink 13, to which the retaining member 23 is fitted. The height Lt is equivalent to the sum of the height of the semiconductor device 41 and the height Lm of the groove 13-3B.

As illustrated in FIGS. 12A and 12B, by choosing the appropriate groove in the heat sink 13 according to the height of the semiconductor device 40 or the semiconductor device 41, and by fitting the retaining member 23 thereto, the same heat sinks 13 can be mounted on semiconductor devices having different heights, using the same retaining members 23 and the same connecting members 33, and with the same press-fitting force.

Although the semiconductor devices 40 and 41 in FIGS. 12A and 12B are packaged using a ball grid array (BGA) package, in which soldering balls are arranged on the bottom surface of the device, the semiconductor devices 40 and 41 may be packaged using other packages, for example, a quad flat package (QFP) (this applies to the first to third embodiments). Furthermore, although the retaining member 23 is illustrated as a spring-like retaining member and the connecting members 33 are illustrated as connecting members with which the spring can be engaged, the retaining member and the connecting members may be of another type, for example, the ends of the retaining member may be screwed onto the board through connecting members formed of screw holes. Thus, various modifications can be made within a scope not departing from the gist of the present invention (this applies to the first to third embodiments).

Figure 2:
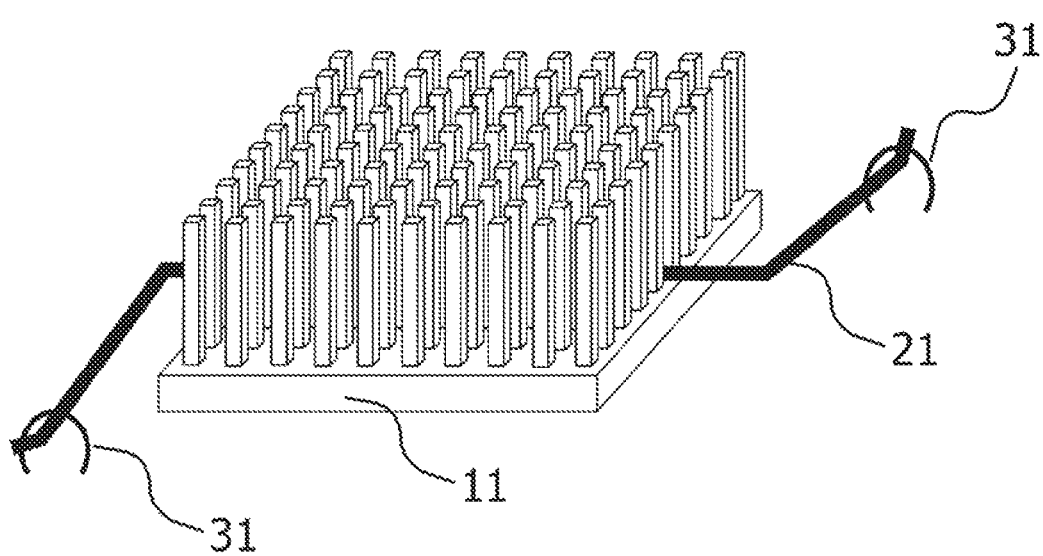
FIG. 2 illustrates an example in which a heat sink having pin-like fins is mounted using a spring-like retaining member.
Figure 3:
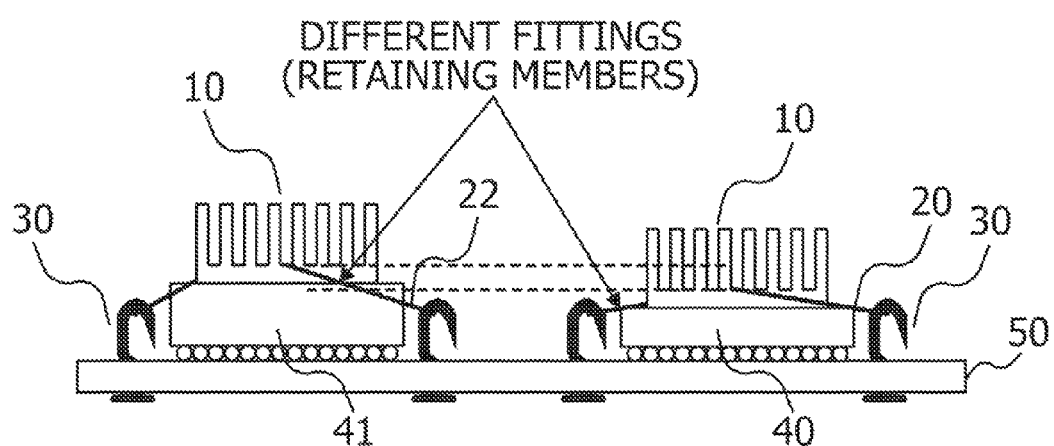
FIG. 3 illustrates a first mounting example in which heat sinks are mounted using spring-like retaining members.
Figure 4:
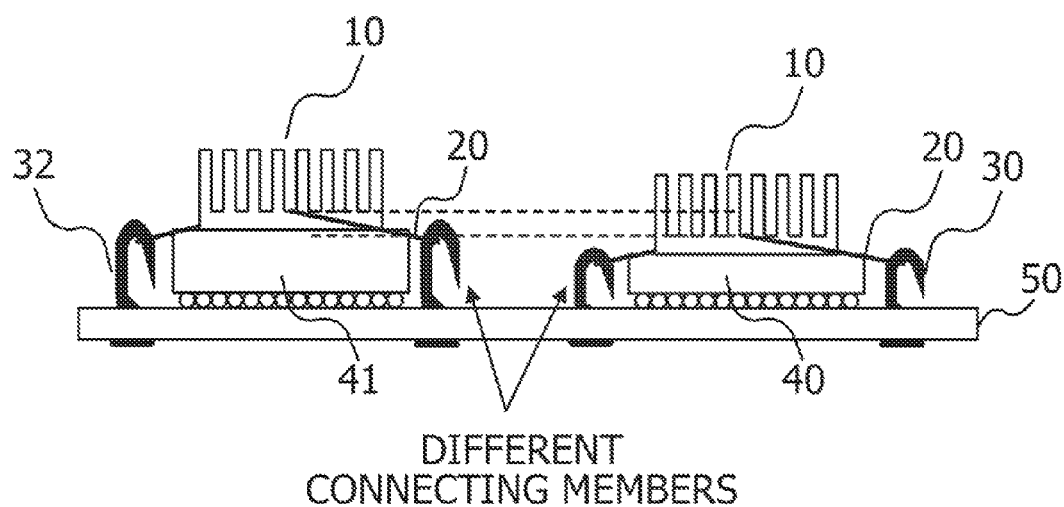
FIG. 4 illustrates a second mounting example in which heat sinks are mounted using spring-like retaining members.
Figure 13A:
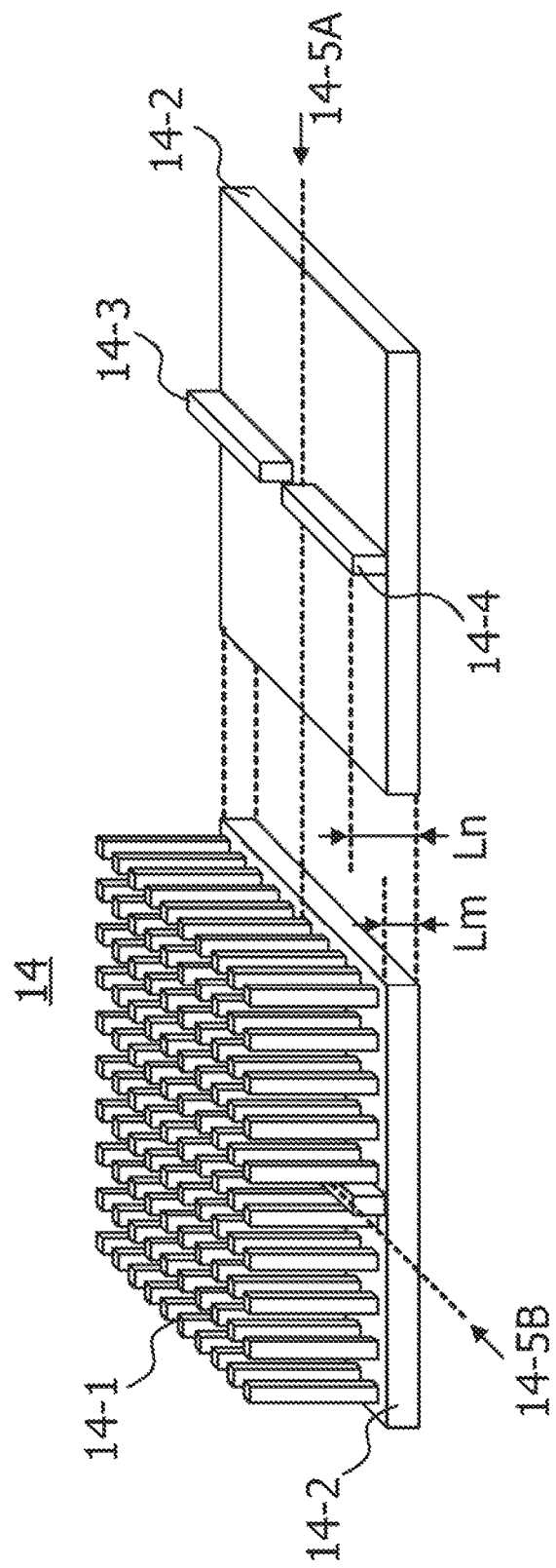
FIGS. 13A and 13B are perspective views of a heat sink according to a third embodiment.
Figure 13B:
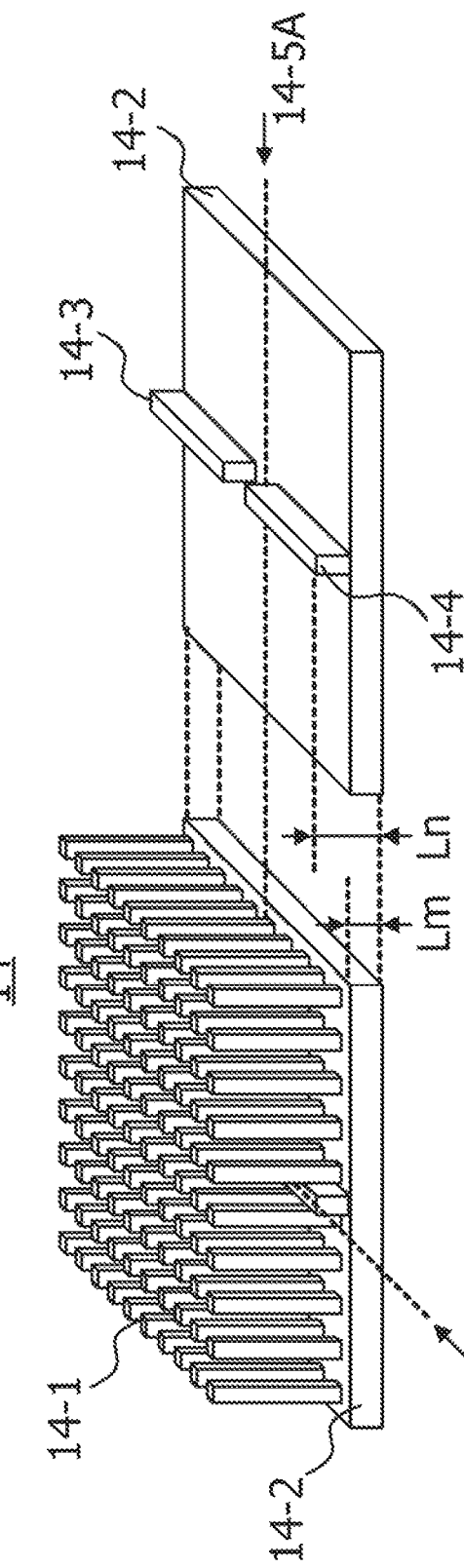

FIGS. 13A and 13B are perspective views of a heat sink 14 according to a third embodiment. The heat sink 14 in FIG. 13 is an embodiment in which the present invention is applied to the heat sink 11 having the pin-like fins illustrated in FIG. 2. Specifically, in the third embodiment, grooves are provided at two heights (Ln and Lm) such that they pass through the center of the heat sink 14, between the pin-like fins 14-1.

FIG. 13A is a perspective view of the heat sink 14 according to the third embodiment, and FIG. 13B is a perspective view of the heat sink 14 without the pin-like fins 14-1. The heat sink 14 has a groove 14-5A at a height Lm, which extends in the lateral direction as viewed from the front in FIG. 13, and a groove 14-5B at a height Ln, which extends in the depth direction as viewed from the front in FIG. 13. Herein, for the ease of description, it is assumed that the height Lm is the same as the height of the base section 14-2, and the height Ln is higher than the height Lm. Furthermore, it is assumed that, when the heat sinks 14 are mounted on two semiconductor devices having different heights, the sum of the height Lm and the height of the semiconductor device having a tall height and the sum of the height Ln and the height of the semiconductor device having a short height are substantially equal.

As illustrated in FIG. 13B, to form the groove 14-5B at a height Ln, which extends in the depth direction as viewed from the front in FIG. 13, members 14-3 and 14-4 having a predetermined height are mounted on the base section 14-2 of the heat sink 14. At this time, the height of the members 14-3 and 14-4 is determined such that the sum of the height Lm of the base 14-2 and the height of the member 14-3 or 14-4 is equivalent to the height Ln. The members 14-3 and 14-4 are mounted with a certain distance therebetween so as to allow the groove 14-5A to extend in the lateral direction at a height Lm, as viewed from the front in FIG. 13. The members 14-3 and 14-4 may be formed integrally with the base section so as to constitute a part of the base section 14-2, or they may be made of a specific material and fixed to the base section 14-2.

Regarding heat sinks having pin-like fins, similarly to the second embodiment illustrated in FIGS. 11 and 12, by providing a plurality of grooves at different heights, as in the heat sink 14 illustrated in FIG. 13, the same heat sinks 14 can be mounted on semiconductor devices having different heights, using the same retaining members and the same connecting members.

Figure 14:
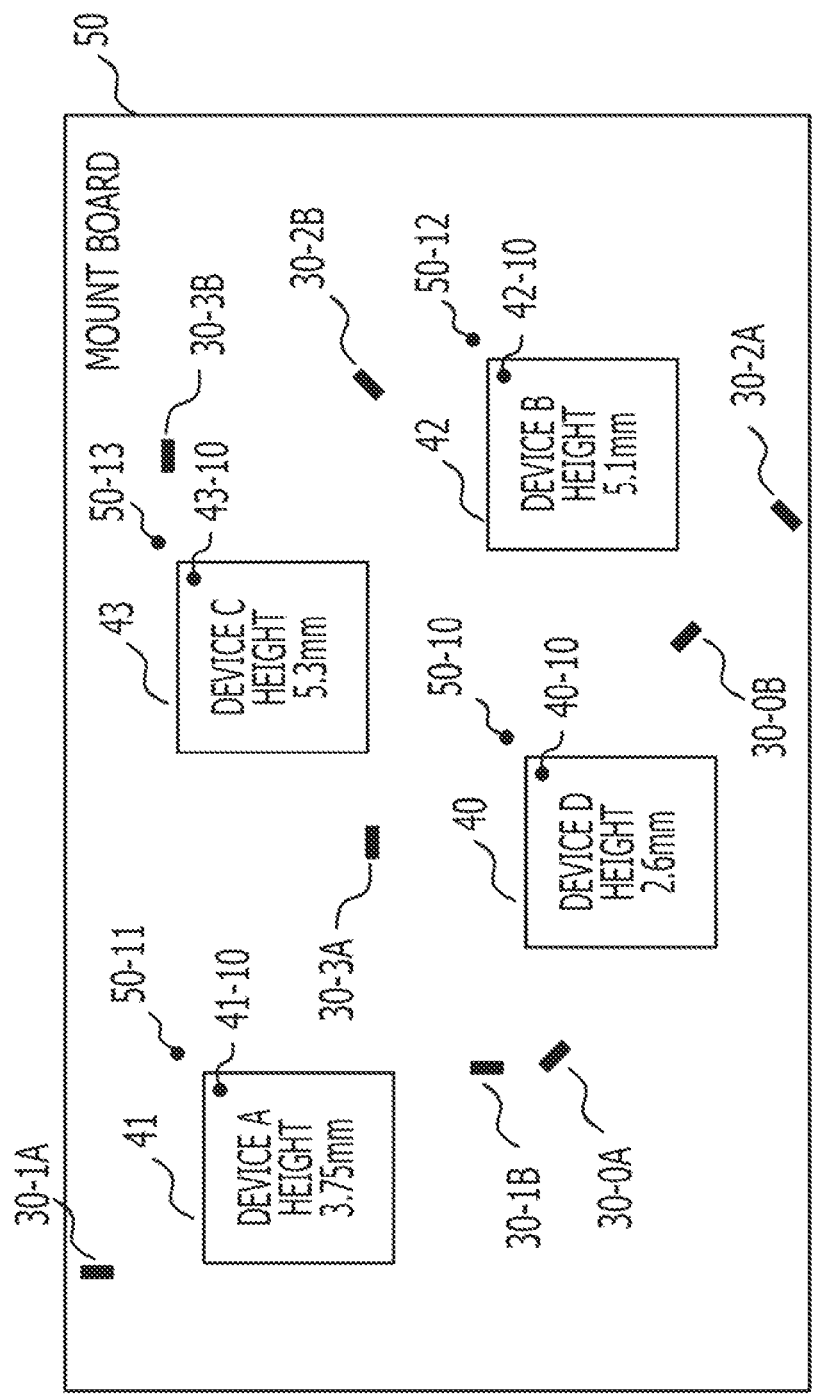
FIG. 14 illustrates an arrangement example of devices on a mount board according to the first embodiment.

FIG. 14 illustrates an arrangement example of devices on a mount board according to the first embodiment. In the example in FIG. 14, four semiconductor devices A to D (devices 40 to 43) having different heights are mounted on a mount board 50. In FIG. 14, the device A (41) has a height of 3.75 mm, the device B (42) has a height of 5.1 mm, the device C (43) has a height of 5.3 mm, and the device D (40) has a height of 2.6 mm. Furthermore, in the example in FIG. 14, two of the same connecting members 30 for each semiconductor device are mounted on the board. Specifically, connecting members 30-1A and 30-1B for the device A, connecting members 30-2A and 30-2B for the device B, connecting members 30-3A and 30-3B for the device C, and connecting members 30-0A and 30-0B for the device D are mounted on the board.

In FIG. 14, filled circular marks 40-10, 41-10, 42-10, and 43-10 on the devices A to D and filled circular marks 50-10, 50-11, 50-12, and 50-13 on the mount board 50 serve as marks for determining the mounting orientation when the devices A to D are mounted on the mount board 50. By mounting the devices A to D such that their marks are aligned with the marks on the mount board, the devices are prevented from being mounted in an incorrect orientation. Although the filled circular marks are used to indicate the mounting orientations of the devices in FIG. 14, other marks may be used. Furthermore, marks having specific shapes may be formed on the devices and the mount board to utilize them as marks during mounting.

FIG. 15 illustrates a mounting example in which the heat sinks 12 according to the first embodiment are mounted on the devices A to D illustrated in FIG. 14. The heat sinks 12 in FIG. 15 have the same shape as those in FIG. 5, and each have four grooves at different heights; 0.7 mm, 0.9 mm, 2.25 mm, and 3.4 mm. Specifically, the heat sinks 12 each have the groove 12-3A at a height of 2.25 mm, the groove 12-3B at a height of 0.9 mm, the groove 12-3C at a height of 0.7 mm, and the groove 12-3D at a height of 3.4 mm. The retaining member 24 is fitted to one of the grooves in the heat sink 12 selected according to the height of the semiconductor device to which the heat sink 12 is to be mounted. In doing so, the sum of the height of each of the semiconductor devices A to D and the height of the corresponding groove in the heat sink 12 is identical, i.e., 6.0 mm. Accordingly, the same heat sinks 12 can be mounted on the four semiconductor devices A to D having different heights, using the same retaining members 24 and the same connecting members 30.

The mounting orientations of the heat sinks can be identified by providing specific marks at specific positions of the heat sinks. In the example in FIG. 15, the heat sinks 12 are mounted on the devices A to D such that the filled circular marks 12-4 provided on the heat sinks 12 and the marks 50-10, 50-11, 50-12, and 50-13 provided on the mount board 50 are aligned. Thus, the heat sinks 12 can be mounted on the mount board such that they are oriented in the same direction. As a result, the directions of the grooves in the heat sinks 12 relative to the mount board 50 are set. Accordingly, the connecting members 30 can be mounted on the mount board 50 in advance at positions corresponding to the direction of the groove in the heat sink 12 to be used, allowing the retaining member 24 to be fitted to the groove according to the height of the semiconductor device.

For example, when the positions of the connecting members for the device A (41) are determined, the positions of the connecting members 30-1A and 30-1B are determined such that the retaining member 24 can be fitted to the groove 12-3A, in which the sum of the height of the groove 12-3A (2.25 mm) and the height of the device A (3.75 mm) is 6 mm. Then, the connecting members 30-1A and 30-1B are mounted on the mount board 50. The positions of the connecting members for each of the devices B to D are also determined such that the retaining member 24 can be fitted to the groove in the heat sink 12, in which the sum of the height of the groove and the height of the device is 6 mm. Then, the connecting members are mounted on the positions determined. Then, using the filled circular marks 12-4, the heat sinks 12 are placed on the semiconductor devices A to D so as to be oriented in the predetermined direction, and the ends of the retaining members 24 are engaged with the connecting members 30 mounted in advance, thereby mounting the heat sinks 12 on the semiconductor devices. Thus, it is possible to prevent an incorrect groove from being used when the heat sinks 12 are mounted on the semiconductor devices having different heights.

The retaining member 24 can be fitted to the appropriate groove when the orientation of the heat sink 12 and the positions of the connecting members 30 for holding the retaining member 24 are aligned. Therefore, a mark may be provided on the mount board 50 or on each semiconductor device to which the heat sink is to be mounted to determine the mounting orientation of the heat sink. Alternatively, the orientation of the heat sink 12 and the positions of the connecting members 30 may be aligned by, for example, painting the grooves in the heat sink 12 in different colors (not illustrated) and painting each of the connecting members 30 in the color used on the groove corresponding to the height of the semiconductor device. As has been described, the method for determining the mounting orientation of the heat sinks may be variously modified within a scope not departing from the gist of the present invention.

In the above-described embodiments, the heat sinks to be mounted on the semiconductor devices on the mount board each have a plurality of grooves at different heights. By using the appropriate grooves in the heat sinks according to the heights of the semiconductor devices from the surface of the mount board to which the heat sinks are to be mounted, the same heat sinks can be mounted on semiconductor devices having different heights, using the same retaining members and the same connecting members, and with the same press-fitting force. In addition, because the direction of the grooves that receive the retaining member to mount the heat sink are clarified by providing marks on the heat sinks and the mount board and by determining the positions of the connecting members provided on the mount board in advance, mounting errors of the heat sinks may be prevented. Accordingly, it is possible to prevent damage to the device caused by excessive pressure applied to the semiconductor device due to an incorrect choice of components occurring when the heat sinks are mounted in the conventional case, and to prevent cooling failure caused by insufficient press-fitting force. In addition, because it is possible to limit the types of heat sinks, retaining members, and connecting members, cost reduction can be achieved.

What is claimed is:

1. A device comprising:
   a mount board;
   a first device mounted on the mount board, the first device having a first thickness;
   a second device mounted on the mount board, the second device having a second thickness thicker than the first thickness; and
   a first heat sink mounted on the first device, the first heat sink including a first groove and a second groove, a first distance between a bottom surface of the first groove and a top surface of the first device is larger than a second distance between a bottom surface of the second groove and the top surface of the first device;
   a second heat sink mounted on the second device, the second heat sink including a third groove and a fourth groove, a third distance between a bottom of the third groove and a top surface of the second device is larger than a fourth distance between a bottom surface of the fourth groove and the top surface of the second device;
   a first retaining member fitting the first heat sink to the first device; and
   a second retaining member fitting the second heat sink to the second device,
   wherein the first retaining member is disposed in the first groove, and the second retaining member is disposed in the fourth groove.

2. The device according to claim 1, wherein
   the first heat sink includes a plurality of first cooling fins, and
   the second heat sink includes a plurality of second cooling fins.

3. The device according to claim 1, wherein
   the first groove and the second groove are provided so as to pass through the center of the first heat sink, and
   the third groove and the fourth groove are provided so as to pass through the center of the second heat sink.

4. The device according to claim 1, wherein
   the first groove and the second groove are provided so as to pass through the center of gravity of the first heat sink, and
   the third groove and the fourth groove are provided so as to pass through the center of gravity of the second heat sink.

5. The device according to claim 1, wherein
   the first distance is equal to the third distance, and
   the second distance is equal to the fourth distance.

6. The device according to claim 1, wherein
   the first heat sink includes a fifth groove, a fifth distance between a bottom surface of the fifth groove and the top surface of the first device is different from the first distance and the second distance, and
   the second heat sink includes a sixth groove, a sixth distance between a bottom surface of the sixth groove and the top surface of the second device is different from the third distance and the fourth distance.

7. A method comprising:
   mounting a first device on a mount board;
   mounting a second device on the mount board;
   mounting a first heat sink on the first device;
   mounting a second heat sink on the second device;
   fitting the first heat sink to the first device using a first retaining member; and
   fitting the second heat sink to the second device using a second retaining member, wherein
   the first device has a first thickness,
   the second device has a second thickness thicker than the first thickness,
   the first heat sink includes a first groove and a second groove, a first distance between a bottom surface of the first groove and a top surface of the first device is larger than a second distance between a bottom surface of the second groove and the top surface of the first device,
   the second heat sink includes a third groove and a fourth groove, a third distance between a bottom of the third groove and a top surface of the second device is larger than a fourth distance between a bottom surface of the fourth groove and the top surface of the second device, and
   the first retaining member is disposed in the first groove, and the second retaining member is disposed in the fourth groove.

8. The method according to claim 7,
wherein the first heat sink and the second heat sink include
a plurality of cooling fins respectively.

9. The method according to claim 7, wherein
the first groove and the second groove are provided so as to pass through the center of the first heat sink, and
the third groove and the fourth groove are provided so as to pass through the center of the second heat sink.

10. The method according to claim 7, wherein
the first groove and the second groove are provided so as to pass through the center of gravity of the first heat sink, and
the third groove and the fourth groove are provided so as to pass through the center of gravity of the second heat sink.

11. The method according to claim 7, wherein
the first distance is equal to the third distance, and
the second distance is equal to the fourth distance.

\* \* \* \* \*